United States Patent

Kidoguchi et al.

[11] Patent Number: 6,133,058
[45] Date of Patent: *Oct. 17, 2000

[54] FABRICATION OF SEMICONDUCTOR LIGHT-EMITTING DEVICE

[75] Inventors: Isao Kidoguchi; Hideto Adachi, both of Mino; Akihiko Ishibashi, Sakai; Kiyoshi Ohnaka, Moriguchi; Yuzaburo Ban, Osaka; Minoru Kubo, Nabari, all of Japan

[73] Assignee: Matsushita Electric Industrial Co., Ltd., Osaka, Japan

[*] Notice: This patent is subject to a terminal disclaimer.

[21] Appl. No.: 09/243,648

[22] Filed: Feb. 3, 1999

Related U.S. Application Data

[62] Division of application No. 08/978,848, Nov. 26, 1997, Pat. No. 5,895,225, which is a division of application No. 08/619,483, Mar. 2, 1996, Pat. No. 5,751,013.

[30] Foreign Application Priority Data

Jul. 21, 1994 [JP] Japan .................................. 6-169394

[51] Int. Cl.⁷ .................................................. H01L 21/00
[52] U.S. Cl. .............................................................. 438/47
[58] Field of Search ................................ 438/26, 29, 46, 438/47

[56] References Cited

U.S. PATENT DOCUMENTS

| | | | |
|---|---|---|---|
| 4,862,471 | 8/1989 | Pankove . | |
| 5,403,773 | 4/1995 | Nitta et al. . | |
| 5,563,422 | 10/1996 | Nakamura et al. | 257/13 |
| 5,578,839 | 11/1996 | Nakamura et al. | 257/96 |
| 5,583,879 | 12/1996 | Yamazaki et al. | 372/45 |
| 5,776,794 | 7/1998 | McCann . | |
| 5,895,225 | 4/1999 | Kidoguchi et al. | 438/47 |

FOREIGN PATENT DOCUMENTS

| | | |
|---|---|---|
| 0 383 215 | 8/1990 | European Pat. Off. . |
| 0 599 224 | 6/1994 | European Pat. Off. . |
| 49-29771 | 3/1974 | Japan . |
| 49-66283 | 6/1974 | Japan . |
| 60-63981 | 4/1985 | Japan . |
| 62-154789 | 7/1987 | Japan . |
| 63-182884 | 7/1988 | Japan . |
| 1-192184 | 8/1989 | Japan . |
| 2-181488 | 7/1990 | Japan . |
| 3-290983 | 12/1991 | Japan . |
| 4-10665 | 1/1992 | Japan . |
| 4-10666 | 1/1992 | Japan . |
| 4-10667 | 1/1992 | Japan . |
| 4-236478 | 8/1992 | Japan . |
| 4-242985 | 8/1992 | Japan . |
| 5-41541 | 2/1993 | Japan . |

(List continued on next page.)

OTHER PUBLICATIONS

Partial English translation of Office Action from corresponding Japanese Patent Application No. 8–505644 dated Aug. 10, 1999.

Shuji Nakamura et al., P–GaN/N–InGaN/N–GaN Double–Heterostructure Blue–Light Emitting Diodes, Jpn. J. Appl. Phys, vol. 32 (1993) pp. L8–L11, Part 2, No. 1A/B, Jan. 15, 1993.

English translation of International Preliminary Examination Report dated Jul. 25, 1996.

International Search Report mailed Nov. 21, 1995.

European Search Report dated Nov. 10, 1998.

English translation of Office Action dated Jan. 12, 1999 from corresponding Japanese Patent Application No. 8–505644 (4 pages).

*Primary Examiner*—John F. Niebling
*Assistant Examiner*—Keith Christianson
*Attorney, Agent, or Firm*—Ratner & Prestia

[57] ABSTRACT

A semiconductor light-emitting device with a double hetero structure, including: an active layer made of $Ga_{1-x}In_xN$ ($0 \leq x \leq 0.3$) doped with a p-type impurity and an n-type impurity; and first and second cladding layers provided so as to sandwich the active layer.

3 Claims, 14 Drawing Sheets

FOREIGN PATENT DOCUMENTS

| | | |
|---|---|---|
| 5-110139 | 4/1993 | Japan . |
| 5-90329 | 4/1993 | Japan . |
| 5-291133 | 11/1993 | Japan . |
| 6-21511 | 1/1994 | Japan . |
| 6-5986 | 1/1994 | Japan . |
| 6-29577 | 2/1994 | Japan . |
| 6-37390 | 2/1994 | Japan . |
| 6-260680 | 9/1994 | Japan . |
| 6-268259 | 9/1994 | Japan . |
| 7-15041 | 1/1995 | Japan . |
| 7-7182 | 1/1995 | Japan . |
| 7-162038 | 6/1995 | Japan . |
| 7-176826 | 7/1995 | Japan . |
| 7-235729 | 9/1995 | Japan . |
| 8-330629 | 12/1996 | Japan . |

FABRICATION OF SEMICONDUCTOR LIGHT-EMITTING DEVICE

This application is a division of U.S. patent application Ser. No. 08/978,848, filed Nov. 26, 1997, U.S. Pat. No. 5,895,225 which is a division of U.S. patent application Ser. No. 08/619,483, filed on Mar. 21, 1996, U.S. Pat. No. 5,751,013.

TECHNICAL FIELD

The present invention relates to a light-emitting device made of gallium nitride type compound semiconductor used for semiconductor light-emitting devices such as blue light-emitting diodes and blue semiconductor lasers and a method for producing the same.

BACKGROUND ART

In recent years, it was reported that a semiconductor device using an $Al_xGa_yIn_zN$ (where $0 \leq x \leq 1$, $0 \leq y \leq 1$, $0 \leq z \leq 1$) type compound semiconductor, which is a III-V-group compound semiconductor containing nitrogen as a V-group element, has outstanding light-emitting characteristics at room temperature. This type of compound semiconductor has been expected to be a material for realizing a blue light-emitting device (e.g., Japanese Journal of Applied Physics 32 (1993) L8–L11). Semiconductor devices having such a gallium nitride type compound semiconductor are obtained by epitaxially growing an n-type semiconductor layer, an i-type semiconductor layer, or a p-type semiconductor layer made of $Al_xGa_{1-x}N$ and $In_yGa_{1-y}N$ (where $0 \leq x \leq 1$, $0 \leq y \leq 1$) on a sapphire substrate.

As a method of epitaxial growth, a Metalorganic Vapor Phase Epitaxy (MOVPE) method, a Molecular Beam Epitaxy (MBE) method, and the like are generally used. For example, the MOVPE method will be briefly described. Organic metal such as trimethylgallium (TMGa; $Ga(CH_3)_3$), trimethylaluminum (TMAl; $Al(CH_3)_3$) and trimethylindium (TMIn; $In(CH_3)_3$) and ammonia ($NH_3$) gas are supplied as a reaction gas into a reaction chamber in which a sapphire substrate is provided. An AlGaInN type compound semiconductor is epitaxially grown on the sapphire substrate while the surface temperature of the substrate is kept at a high temperature of 700 to 1100° C. At this time, the AlGaInN type compound semiconductor can be controlled so as to have p-type conductivity, i-type conductivity, or n-type conductivity by supplying diethylzinc (DEZn; $Zn(C_2H_5)_2$), silane ($SiH_4$) or the like to the reaction chamber.

As a known typical device using an AlGaInN type compound semiconductor, there is a blue light-emitting diode (e.g., Japanese Journal of Applied Physics 32 (1993) L8–L11). This light-emitting diode has a double hetero structure including an active layer made of $In_{0.05}Ga_{0.95}N$, to which zinc (Zn) is added. This is because the light-emission wavelength is adjusted to about 0.45 µm. In this manner, only zinc is added to an active layer in the conventional light-emitting diode using an InGaN active layer.

Furthermore, a light-emitting diode having an MIS structure including an active layer made of $Al_xGa_{1-x}N$ is reported (Japanese Laid-Open Patent Publication Nos. 4-10665, 4-10666, and 4-10667). In this light-emitting diode, Zn and Si are simultaneously added to an i-type GaN which is to form a light-emitting layer, so as to change the wavelength of the emitted light.

However, these conventional light-emitting diodes have the following problems:

In the case where only Zn is added to an $In_yGa_{1-y}N$ layer, a Zn atom pairs off with an intrinsic defect such as vacancy in the $In_yGa_{1-y}N$ layer to be stabilized. However, this decreases the emission efficiency because the intrinsic defect becomes a non-radiative center. In addition, the intrinsic defect increases under the application of an electric field, causing adverse effects such as an increased driving current and decreased reliability of the light-emitting device. In particular, these problems become serious in semiconductor lasers requiring high optical density and carrier density. Furthermore, in the case of using Zn as a p-type impurity, a large amount of Zn should be added because of its low activation ratio.

In order to increase the light-emission wavelength, an increase in the In composition of $In_yGa_{1-y}N$ used for an active layer is required. For example, the wavelength is desirably in a blue-green region, i.e., about 520 nm in the case of traffic lights and the like. For this purpose, the amount of In in an $In_yGa_{1-y}N$ active layer is required to increase. However, the increase in amount of In decreases the quality of crystal, resulting in the decrease in emission efficiency. Thus, it is difficult to obtain a light-emitting device emitting light having a long wavelength by increasing a composition ratio (mole fraction) of In.

In the case where an AlGaN layer is used as an active layer, its bandgap energy is 3.44 eV or more at room temperature, that is, the wavelength of the emitted light is 360 nm or less. Therefore, even when zinc a nd silicon are simultaneously added in large amounts, the light-emission wavelength is not in a blue region. Thus, it is very difficult to obtain a blue light-emitting device by using an AlGaN layer as an active layer. The AlGaN layer also has a problem in that a deep impurity level is likely to be formed, causing unnecessary light emitted through the deep impurity level; thereby increasing a working current of the light-emitting device.

III-group nitrides, such as $Al_xGa_{1-x}N$ and $In_yGa_{1-y}N$, are stable materials which are not subject to corrosion by chemical agents and are difficult to etch. Thus, it is difficult to form a structure for confining carriers in an active layer in a light-emitting device such as a semiconductor laser.

Furthermore, it is difficult to form a cavity of a semiconductor laser by cleavage because a sapphire substrate is used in a GaN type light-emitting device. The formation of a cavity can be considered to be done by dry etching such as reactive ion etching, ion milling, and focused ion beam etching. In this case, defects are formed in a semiconductor layer in the vicinity of facets of the cavity. These defects cause problems similar to those caused by the above-mentioned intrinsic defect.

In a semiconductor light-emitting device using an insulating substrate such as a sapphire substrate, electrodes cannot be provided on a substrate side. Therefore, a step difference is provided in a part of a semiconductor layer forming the light-emitting device, and electrodes are required to be respectively provided on a convex portion and a concave portion formed by the step difference. In the case of a GaN type light-emitting device, a step difference of 1 µm or more is required. However, in this case, it becomes difficult to allow a semiconductor layered structure forming a semiconductor light-emitting device to adhere to a heat sink having good heat conduction. In the case where heat-releasing of a semiconductor light-emitting device having a step difference is imperfect, there are problems in that a working current increases along with the increase in temperature of the device and reliability of the device decreases.

Furthermore, when excess stress is applied to an active layer while the semiconductor layered structure forming the semiconductor light-emitting device is allowed to adhere to the heat sink, there is a possibility that light-emission stops. Even in the case where the amount of stress is small, there is a problem in that birefringence is caused in materials forming the semiconductor layered structure, and plane of polarization of light emitted from the semiconductor light-emitting device rotates. For example, this causes inconvenience in the case where a semiconductor laser is used for an optical disk or the like.

The present invention solves the above-mentioned problems in the prior art and provides a highly reliable light-emitting device capable of emitting light with a wavelength in the blue region at high emission efficiency. Moreover, the present invention provides a semiconductor light-emitting device which has an outstanding heat-releasing property and in which there is less rotation of the plane of polarization of emitted light. Furthermore, the present invention provides a method for producing such a blue light-emitting device in simple steps with high yield.

DISCLOSURE OF THE INVENTION

A semiconductor light-emitting device according to the present invention has a double hetero structure, including: an active layer made of $Ga_{1-x}In_xN$ ($0 \leq x \leq 0.3$) doped with a p-type impurity and an n-type impurity; and first and second cladding layers provided so as to sandwich the active layer.

In a preferred embodiment, the active layer is substantially uniformly doped with the p-type impurity and the n-type impurity.

In a preferred embodiment, the first cladding layer has a p-type conductivity; concentration of the p-type impurity in the active layer is low on a side adjacent to the first cladding layer; and concentration of the p-type impurity in the active layer is high on a side adjacent to the second cladding layer.

In a preferred embodiment, the active layer has a structure in which a plurality of p-type layers doped only with a p-type impurity and a plurality of n-type layers doped only with an n-type impurity are alternately layered.

In a preferred embodiment, the first cladding layer has a p-type conductivity, and impurity concentration of the plurality of p-type layers in the active layer increases from a side adjacent to the first cladding layer to a side adjacent to the second cladding layer.

In a preferred embodiment, the plurality of p-type layers and the plurality of n-type layers are substantially uniformly doped with the p-type impurity and the n-type impurity, respectively.

In a preferred embodiment, the active layer has a structure in which the plurality of GaN layers and the plurality of InN layers are alternately layered, and only the plurality of InN layers are doped with the p-type impurity and the n-type impurity.

In a preferred embodiment, the active layer is doped with the p-type impurity and the n-type impurity respectively in an impurity concentration in the range of $10^{17}$ cm$^{-3}$ to $10^{20}$ cm$^{-3}$.

In a preferred embodiment, the p-type impurity is either of zinc, magnesium, or carbon; and the n-type impurity is either of silicon, sulfur, selenium, or tellurium.

In a preferred embodiment, the first and second cladding layers are made of $Al_yGa_{1-y}N$ ($0 \leq y \leq 0.3$).

In a preferred embodiment, the first cladding layer has a p-type conductivity, and difference in energy of conduction bands of the active layer and the first cladding layer is 0.3 eV or more.

Another semiconductor light-emitting device according to the present invention has a double hetero structure made of $Al_xGa_yIn_z$ (where $0 \leq x \leq 1$, $0 \leq y \leq 1, 0 \leq z \leq 1$), including an active layer and an n-type cladding layer and a p-type cladding layer provided so as to sandwich the active layer, wherein the p-type cladding layer has a region containing hydrogen and a region not containing hydrogen; whereby light in a blue region can be emitted at high emission efficiency.

In a preferred embodiment, the active layer is made of undoped $Al_xGa_yIn_zN$, or $Al_xGa_yIn_zN$ doped with a p-type impurity and an n-type impurity.

In a preferred embodiment, the semiconductor light-emitting device is a semiconductor laser, and the active layer is doped with hydrogen in the vicinity of two facets.

A method for producing a semiconductor light-emitting device according to the present invention, includes the steps of: forming a mask layer having a predetermined pattern on a semiconductor structure made of $Al_xGa_yIn_zN$ (where $0 \leq x \leq 1, 0 \leq y \leq 1, 0 \leq z \leq 1$, including an active layer and first and second cladding layers sandwiching the active layer, the semiconductor structure being provided on a substrate, the first cladding layer being sandwiched between the substrate and the active layer; introducing hydrogen into the second cladding layer, using the mask layer as a mask, while keeping the semiconductor structure in a gas containing hydrogen excited into plasma and; removing the mask layer; and forming an electrode on the semiconductor structure, whereby a blue light-emitting device can be produced by simple steps with high yield.

In a preferred embodiment, the hydrogen in the step of introducing hydrogen is plasma-exited by using electron cyclotron resonance.

In a preferred embodiment, the mask layer is an n-type semiconductor layer or an undoped semiconductor layer.

In a preferred embodiment, the mask layer is made of silicon oxide or silicon nitride.

Another method for producing a semiconductor light-emitting device according to the present invention includes the steps of: forming a semiconductor structure made of $Al_xGa_yIn_zN$ (where $0 \leq x \leq 1, 0 \leq y \leq 1, 0 \leq z \leq 1$), including an active layer and first and second cladding layers sandwiching the active layer on a substrate; forming a cavity of a semiconductor laser by dry etching; introducing hydrogen into a semiconductor layered structure through a facet of the cavity while keeping the substrate in a gas containing hydrogen excited into plasma, or a hydrogen compound excited into plasma, whereby a blue light-emitting device can be produced by simple steps with high yield.

Still another method for producing a semiconductor light-emitting device according to the present invention includes the steps of: forming a semiconductor structure made of $Al_xGa_yIn_zN$ (where $0 \leq x \leq 1, 0 \leq y \leq 1, 0 \leq z \leq 1$), including an active layer and first and second cladding layers sandwiching the active layer on a substrate; forming a mask layer having a predetermined pattern on the semiconductor structure; implanting an ionized substance into the semiconductor structure, using the mask layer as a mask; and removing a region of the semiconductor structure in which the ionized substance is implanted by wet etching, whereby a blue light-emitting device can be produced by simple steps with high yield.

Still another method for producing a semiconductor light-emitting device according to the present invention includes the steps of: forming a semiconductor structure including an active layer and first and second cladding layers sandwiching the active layer on a substrate; removing portions of the active layer and the first and second cladding layers to form a projected portion and a concave portion in the semiconductor structure; forming first and second electrodes on the concave portion and the projected portion of the semiconductor structure; and providing the semiconductor layered structure on a heat sink having a step difference large than a step difference between the projected portion and the concave portion of the semiconductor structure in such a manner that the projected portion of the heat sink comes into contact with the first electrode and a concave portion of the heat sink comes into contact with the second electrode, whereby a semiconductor light-emitting device can be produced which has an outstanding heat-releasing property and in which plane of polarization of emitted light less rotates.

In a preferred embodiment, the heat sink has first and second bumps on the projected portion and the concave portion, and the first bump presses the heat sink and the semiconductor layered structure after coming into contact with the first electrode, thereby bringing the second bump into contact with the second electrode.

In a preferred embodiment, in the step of providing the semiconductor layered structure, resin is coated onto surfaces of the projected portion and the concave portion of the heat sink, and the semiconductor layered structure and the heat sink are fixed to each other by curing the resin.

In a preferred embodiment, the resin is a UV-curable resin, and UV-light is emitted by applying a voltage to the semiconductor structure, whereby the resin is cured.

In a preferred embodiment, the active layer is made of $Al_xGa_yIn_zN$ (where $0 \leq x \leq 1$, $0 \leq y \leq 1$, $0 \leq z \leq 1$) or ZnMgSSe.

BEST MODE FOR CARRYING OUT THE INVENTION

EXAMPLE 1

Figure 1:
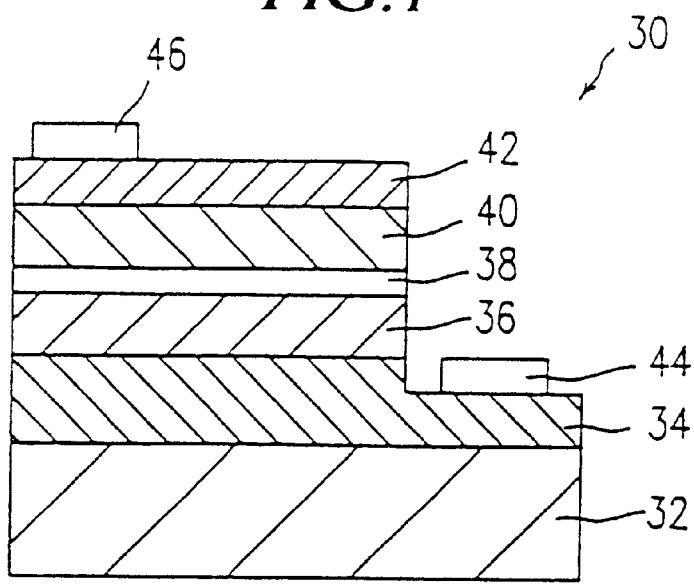
FIG. 1 shows a cross-section of a semiconductor light-emitting device of the first example according to the present invention.

FIG. 1 is a cross-sectional view of a light-emitting diode 30 of the first example according to the present invention.

The light-emitting diode 30 has an active layer 38 and cladding layers 36 and 40 which are provided so as to sandwich the active layer 38. The active layer 38 is made of $In_{0.05}Ga_{0.95}N$. On the other hand, the cladding layer 36 is made of $Al_{0.1}Ga_{0.9}N$ doped with silicon as an n-type impurity, and the cladding layer 40 is made of $Al_{0.1}Ga_{0.9}N$ doped with magnesium as a p-type impurity. Therefore, the light-emitting diode 30 has a double hetero structure in which heterojunctions are formed between the active layer and the cladding layers.

The n-type cladding layer 36 is provided on a sapphire substrate 32 having, for example, a (0001) plane via a contact layer 34 made of n-type GaN:Si. A contact layer 42 made of p-type GaN:Mg is provided on the p-type cladding layer 40. Furthermore, an electrode 46 made of two layers of Au and Ni is provided on the contact layer 42. Furthermore, the contact layer 42, the cladding layer 40, the active layer 38, and the cladding layer 36 are partially removed by etching. A part of the contact layer 34 is also etched up to approximately midpoint in the thickness direction, and an electrode 44 made of Al is provided on a face of the contact layer 34 exposed by etching.

Figure 2A:
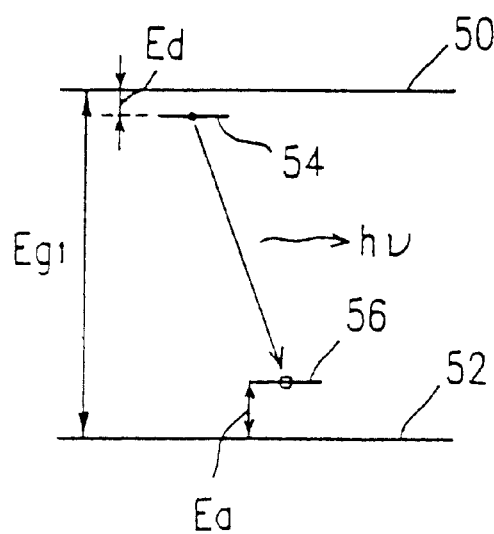
FIG. 2 schematically shows bandgap energy of active layers of the semiconductor light-emitting device shown in FIG. 1 and a conventional semiconductor light-emitting device.
Figure 2B:
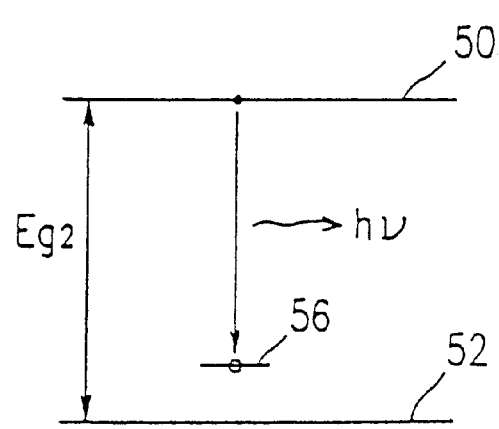

The active layer 38 has a thickness of about 1 μm, and the active layer 38 is substantially uniformly doped with zinc (Zn) functioning as a p-type impurity and silicon (Si) functioning as an n-type impurity. The wavelength of light emitted by the active layer 38 is about 460 nm. In the case where the active layer 38 is doped with both an n-type impurity and a p-type impurity, the wavelength λ of emitted light is given by the following equations:

$$h\nu = E_g - (E_a + E_d) + e/\epsilon r [eV]$$

$$\lambda = 1.2395/h\nu [\mu m]$$

where $E_g$ is the bandgap of an active layer; $E_a$ is activation energy of an acceptor level; $E_d$ is activation energy of a donor level; r is the distance between donor atoms and acceptor atoms; $\epsilon$ is the dielectric constant of an active layer; and e is the electron charge. In the case where $E_d$ is larger than $e/\epsilon r$, the active layer 38 can emit light having a wavelength longer than that determined by the bandgap of the active layer. This will be described in more detail with reference to FIG. 2. In the case where the active layer 38 is doped with zinc and silicon, a donor level 54 of silicon is formed at a position lower from a conduction band 50 by $E_d$ and an acceptor level 56 of zinc is formed at a position higher than a valence band 52 by $E_a$. Electrons in the conduction band 50 are capable of transferring to the donor level 54 by non-radiative transition and transferring to the acceptor level 56 while emitting light.

Thus, in a conventional light-emitting device including an active layer with a bandgap $E_{g2}$, light having a wavelength $\lambda$ emitted in the case where electrons transfer directly from the conduction band 50 to the acceptor level 56 is allowed to be emitted from an active layer with a bandgap $E_{g1}$ which is larger than $E_{g2}$. As a result, it becomes possible to emit light having a long wavelength even when a composition ratio of indium (In) is small, and a highly reliable light-emitting diode can be obtained which emits light having a wavelength in a blue region at high emission efficiency, by using high-quality crystal with a small composition ratio of indium.

Also, a recombination probability increases due to the acceptor level and the donor level formed by doping zinc and silicon, so that an emission efficiency also improves. Furthermore, in the case where an InGaN layer is doped only with zinc, a zinc atom pairs off with an intrinsic defect such as vacancy to be stabilized in the InGaN layer. However, by doping the InGaN layer with both zinc and silicon, the generation of an intrinsic defect is suppressed and emission efficiency improves.

Figure 3:
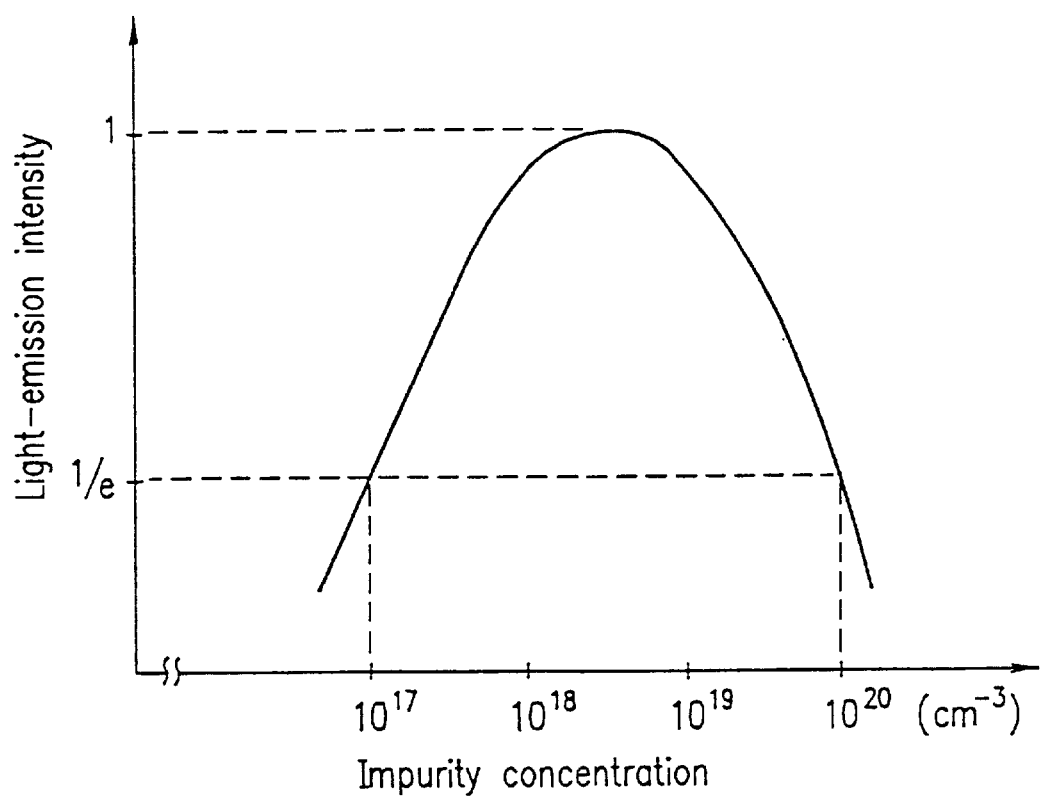
FIG. 3 is a graph showing the relationship between the impurity concentration and the light-emission intensity.

When the added amount of zinc and silicon is large, the acceptor level and the donor level are formed in great numbers, so that the emission efficiency of the light-emitting diode 30 increases. However, when the added amount is too large, the emission efficiency decreases. This is because impurity atoms enter interstitial positions and the like, when their amount is large, thereby decreasing the quality of crystal itself. FIG. 3 shows the relationship between the light-emission intensity and the impurity concentration of doped silicon. As shown in FIG. 3, in the case where impurity concentration of doped silicon is in the order of $10^{18}$ cm$^{-3}$, high light-emission intensity can be obtained. Assuming that the highest light-emission intensity is 1 and a practically preferable range is up to the impurity concentration giving an intensity of 1/e, it is understood that impurities are doped preferably in the range of about $10^{17}$ cm$^{-3}$ to about $10^{20}$ cm$^{-3}$.

The added amounts of zinc and silicon can be the same or either one of them may be larger. However, the same amounts of zinc and silicon are preferably doped, because impurity level densities become equal to each other. Generally, since the activation efficiency of silicon is larger than that of zinc, in the case where zinc and silicon are doped in the impurity concentration at the same level, the conductivity of the active layer becomes an n-type. However, in order to improve the emission efficiency by increasing the hole concentration, the concentration of zinc can be increased so that the conductivity of the active layer 38 becomes a p-type.

As is understood from the above description, in order to obtain a high quality active layer, the composition ratio x of In in In$_x$Ga$_{1-x}$N forming the active layer is preferably small. However, it is technically possible to obtain an active layer containing In in the range of $0 \leq x \leq 0.3$. In the case where zinc and silicon are doped as impurities, the light-emission wavelength can be adjusted by regulating the composition ratio of In in this range.

On the other hand, the cladding layers 36 and 40 are made of Al$_y$Ga$_{1-y}$N having an arbitrary Al composition ratio y in the range of $0 \leq y \leq 1$. However, considering the lattice matching with the active layer, the Al composition ratio y is preferably in the range of $0 \leq y \leq 0.3$. Furthermore, in order to confine carriers in the active layer efficiently, the energy difference $\Delta E_c$ of the conduction band between the active layer 38 and at least the p-type cladding layer 40 is preferably 0.3 eV or more. The cladding layers 36 and 40 can have different compositions. For example, the cladding layer 36 made of GaN and the cladding layer 40 made of Al$_{0.15}$Ga$_{0.85}$N may be used.

Hereinafter, an example of a method for producing the light-emitting diode 30 will be described with reference to FIGS. 4(a) through 4(e).

The contact layer 34 made of n-GaN, the cladding layer 36 made of n-Al$_{0.1}$Ga$_{0.9}$N, the active layer 38 made of In$_{0.05}$Ga$_{0.9}$N doped with Si, the cladding layer 40 made of p-Al$_{0.1}$Ga$_{0.9}$N, and the contact layer 42 made of p-GaN are epitaxially grown on the sapphire substrate 32 having a (0001) plane, by a crystal growth method such as a Metalorganic Vapor Phase Epitaxy (MOVPE) method. Furthermore, a SiO$_2$ film 60 is deposited on the contact layer 42 by using a thermal CVD method or the like (FIG. 4(a)). The SiO$_2$ film 60 is partially removed by etching, using a photolithography technique and an etching technique, whereby a part 64 of the contact layer 42 is exposed (FIG. 4(b)).

Figure 4A:
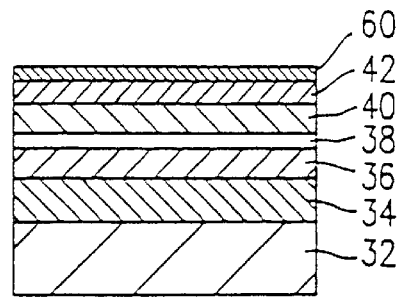
FIGS. 4(a) through 4(e) are cross-sectional views showing the fabrication process for the semiconductor light-emitting device shown in FIG. 1.
Figure 4B:
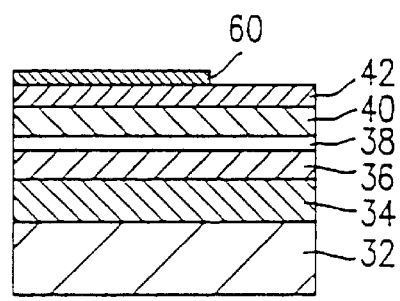
Figure 4C:
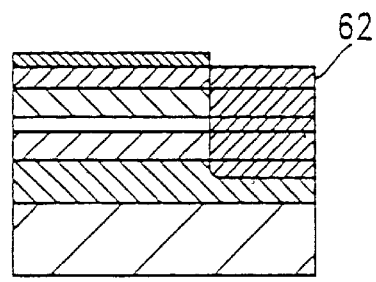
Figure 4D:
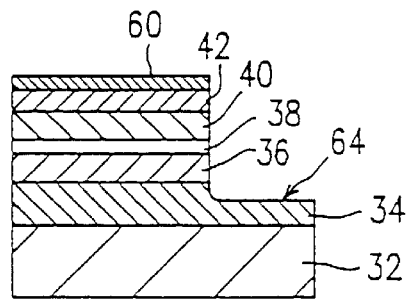

Si is implanted by an ion implantation method through the surface of the contact layer 42 using the etched SiO$_2$ film 60 as a mask so as to reach the midpoint of the contact layer 34 (FIG. 4(c)). This damages a region 62 with Si implanted therein and degrades crystallinity. Thereafter, the region 60 with Si ions implanted therein, i.e., portions of the contact layer 42, the cladding layer 40, the active layer 38, the cladding layer 36, and the contact layer 34; are removed by soaking in sulfuric acid (H$_2$SO$_4$) (FIG. 4(d)). Etching of the region 62 with Si ions implanted therein is relatively easy. Other etchants such as phosphoric acid (H$_3$PO$_4$) and sodium hydroxide (NaOH) can be used. On the other hand, a region without Si ions implanted therein is not etched by sulfuric acid.

Figure 4E:
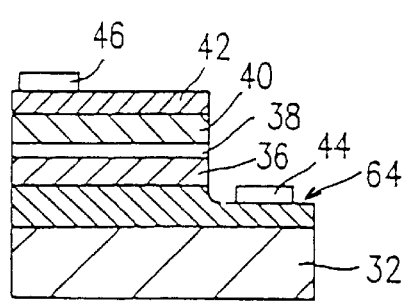

Thereafter, the SiO$_2$ film 60 is removed, and the electrodes 46 and 44 are formed on the contact layer 42 and the exposed portion 64 of the contact layer 34, respectively (FIG. 4(e)).

According to the method as described above, the light-emitting diode 30 as shown in FIG. 1 can be produced. Because of the use of wet etching, the steps of producing the light-emitting diode are simplified, whereby production yield can be enhanced.

Figure 5A:
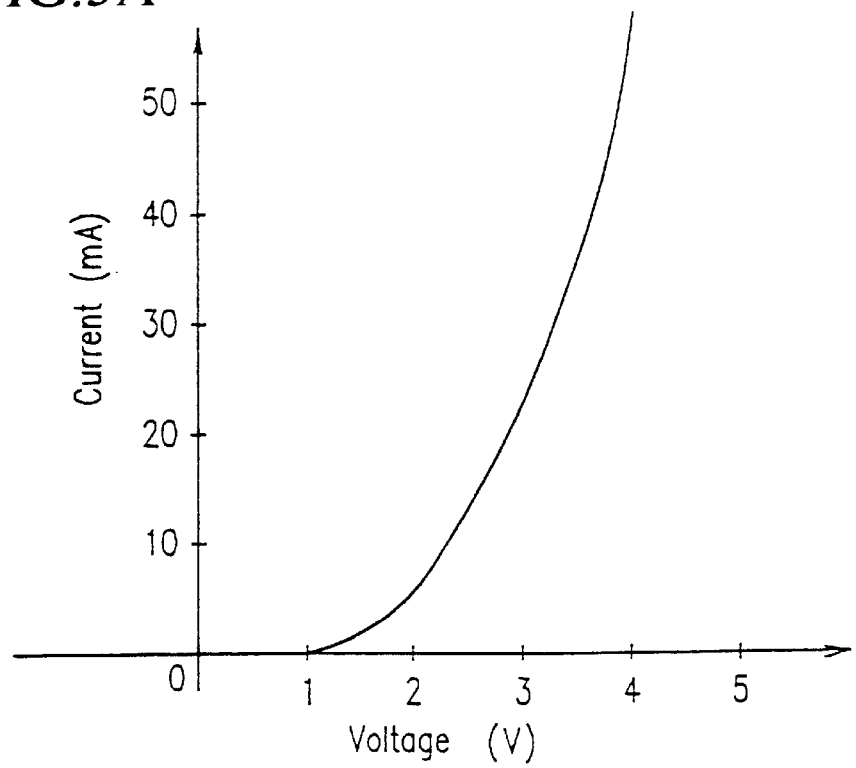
FIGS. 5(a) and 5(b) show electrical characteristics and optical characteristics of the semiconductor light-emitting device of the first example according to the present invention.
Figure 5B:
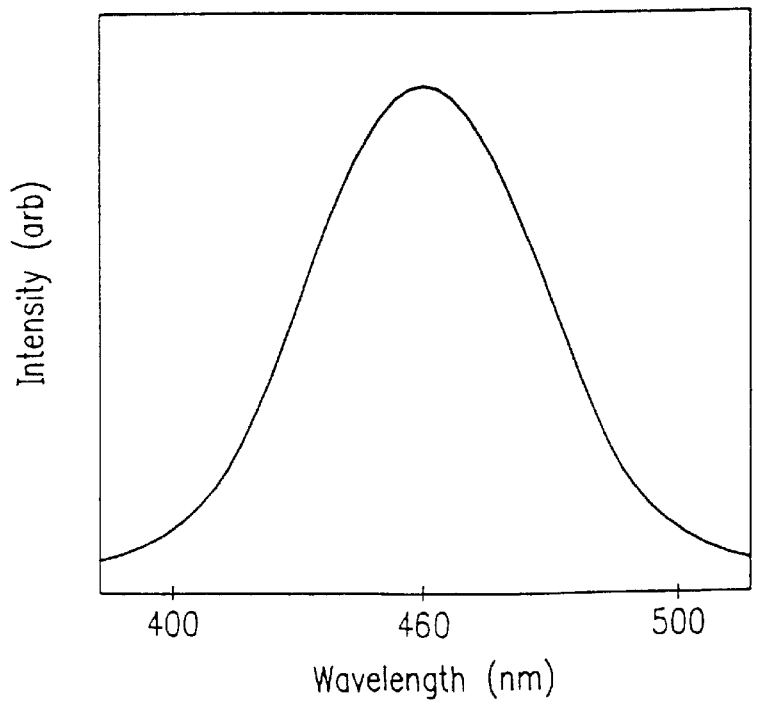

The electrical characteristics and optical characteristics of the light-emitting diode 30 thus produced are shown in FIGS. 5(a) and (b). It is understood that a satisfactory diode with a threshold voltage of 2 volts is obtained and the light-emission wavelength is in a blue region of 460 nm.

It is possible to make various alterations as described below with respect to the active layer 38 used for the light-emitting diode 30 shown in the above example.

First, the wavelength of light emitted from the active layer can be regulated by appropriately selecting the composition of the active layer 38 and a p-type impurity and an n-type impurity with which the active layer 38 is doped. More specifically, light in the vicinity of a wavelength of 460 nm can be emitted by doping $In_{0.10}Ga_{0.90}N$ with zinc and silicon as the p-type impurity and the n-type impurity. Light with the same wavelength can also be emitted even by doping $In_{0.20}Ga_{0.80}N$ with magnesium (Mg) as the p-type impurity, and with either of sulfur (S), selenium (Se), or tellurium (Te) as the n-type impurity. Light in the vicinity of a wavelength of 500 nm can be emitted by doping $In_{0.30}Ga_{0.70}N$ with magnesium and silicon as the p-type impurity and the n-type impurity, respectively. Magnesium is not likely to diffuse in a semiconductor, so that the emission efficiency increases when magnesium is selected as the p-type impurity. In addition, when magnesium is selected, the process steps of producing a device become simplified because magnesium is the same material as the p-type impurity used in the cladding layer. Carbon (C) can be used in place of the above-mentioned p-type impurities. Carbon is not likely to diffuse in a semiconductor, so that it can be doped in a high concentration, thereby increasing the emission efficiency. For example, when GaN is doped with Si and C, light with a wavelength of 430 nm can be emitted. Since the acceptor level of C is low, energy between the donor level of Si and the acceptor level of C increases, and the wavelength shortens.

Figure 6:
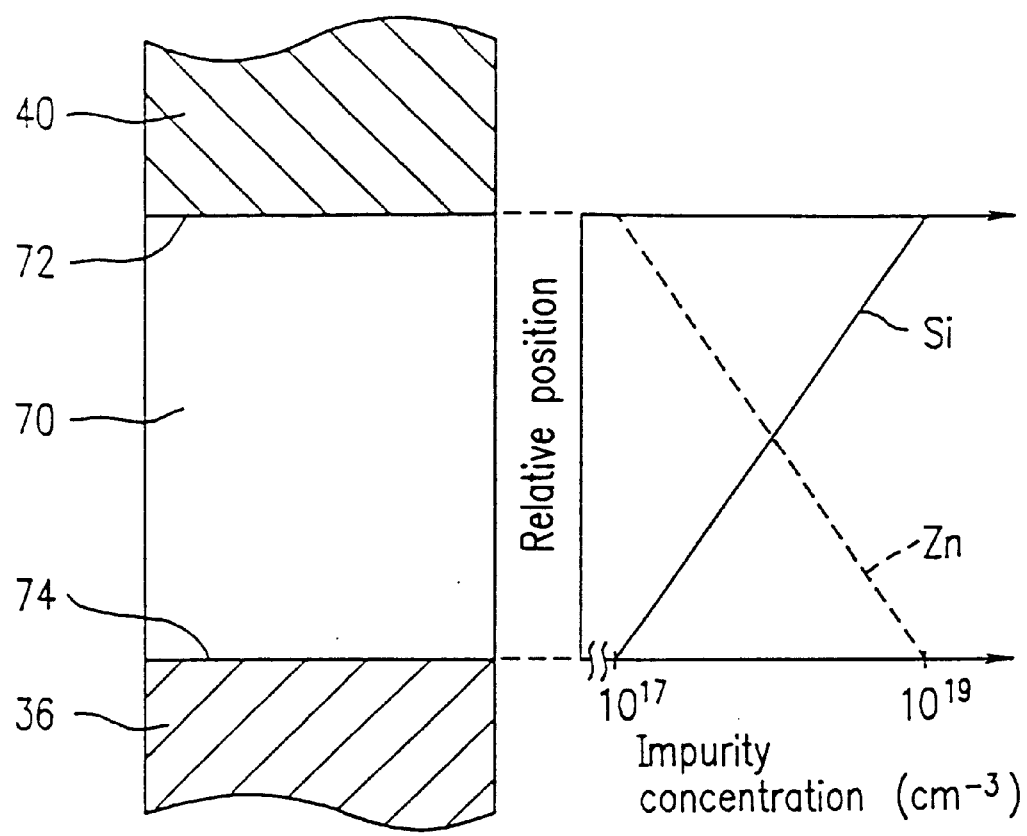
FIG. 6 shows the distribution of the impurity concentration in another active layer of the first example.

The impurity concentration can have a gradient in the active layer of the light-emitting diode. FIG. 6 shows the impurity concentration of an active layer 70 between cladding layers 36 and 40. The active layer 70 is the same as the active layer 38 in that it is doped with zinc and silicon. However, the concentration of zinc which is a p-type impurity increases from a face 72 in contact with the cladding layer 40 made of p-type $Al_{0.1}Ga_{0.9}N$, to a face 74 in contact with the cladding layer 36 made of n-type $Al_{0.1}Ga_{0.9}N$. The concentration of zinc on the face 72 is about $10^{17}$ cm$^{-3}$ and that on the face 74 is about $10^{19}$ cm$^{-3}$. On the other hand, the concentration of silicon which is an n-type impurity increases from the face 74 in contact with the cladding layer 360 made of n-type $Al_{0.1}Ga_{0.9}N$, to the face 72 in contact with the cladding layer 40 made of p-type $Al_{0.1}Ga_{0.9}N$. The concentration of silicon on the face 74 is about $10^{17}$ cm$^3$ and that on the face 72 is about $10^{19}$ cm$^{-3}$. FIG. 6 exemplifies that the concentration of impurities linearly change. However, as long as the concentration of zinc is smaller on the face 72 side and larger on the face 74 side, the concentration may change in stages or may have a curved gradient.

In such a structure, the p-type impurity concentration in the active layer 70 increases with the distance from the p-type cladding layer 40, so that holes with small mobility can be allowed to diffuse in the active layer 70 far away from the face 72 in contact with the cladding layer 40. Thus, it becomes possible to enlarge the thickness of the active layer 70 and to further increase the emission efficiency. Herein, the case is illustrated in which the distributions of the concentrations of Si as an n-type impurity and a p-type impurity are symmetric. However, the n-type impurity may be uniformly distributed across the active layer 7.

Figure 7A:
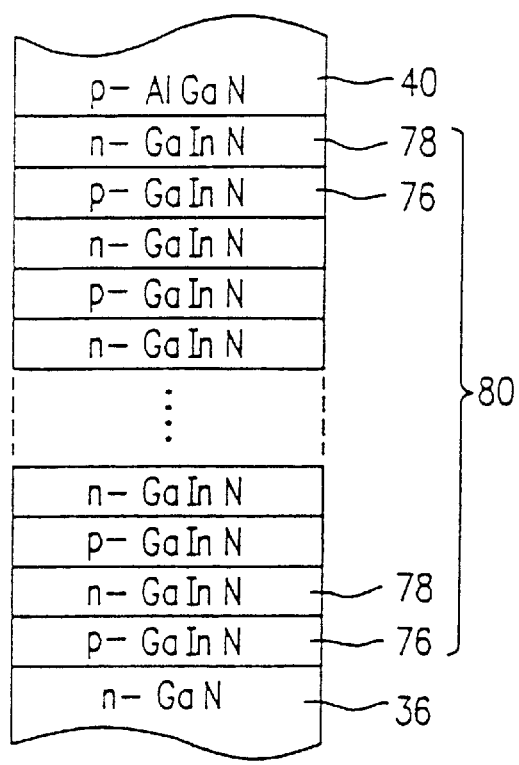
FIG. 7(a) is a cross-sectional view showing the structure of another active layer of the first example.

Furthermore, the active layer can have a so-called modulation doping structure. As shown in FIG. 7(a), in an active layer 80 sandwiched between the cladding layers 36 and 40, a plurality of $In_{0.05}Ga_{0.95}N$ layers 76 doped only with a p-type impurity and a plurality of $In_{0.05}Ga_{0.95}N$ layers 78 doped only with an n-type impurity are alternately layered. In this structure, electrons and holes are spatially separated from each other. Therefore, the recombination probability increases and the emission efficiency is enhanced by an order of magnitude compared with the case where electrons and holes are not spatially separated from each other.

Figure 7B:
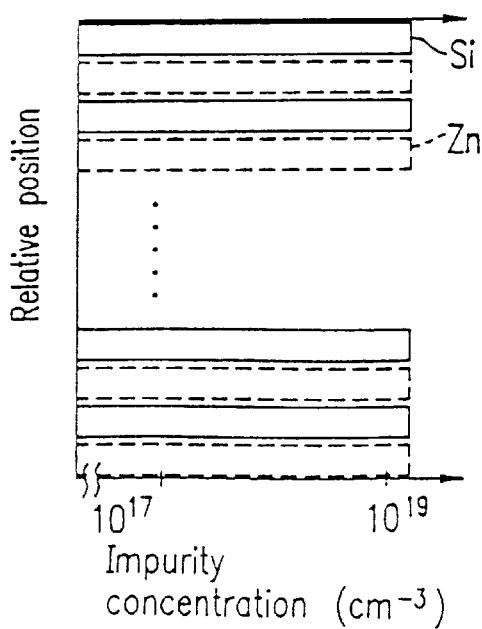
FIG. 7(b) is the distribution of the impurity concentration in the structure shown in FIG. 7(a).
Figure 7C:
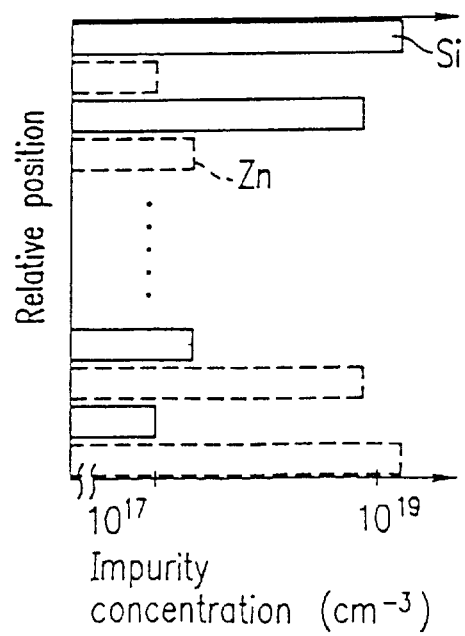
FIG. 7(c) shows another distribution of the impurity concentration in the structure shown in FIG. 7(a).

The impurity concentration of each $In_{0.05}Ga_{0.95}N$ layer 76 and $In_{0.05}Ga_{0.95}N$ layer 78 can be the same as shown in FIG. 7(b). In this case, the respective concentration was prescribed to be about $10^{19}$ cm$^{-3}$. Furthermore, as described with reference to FIG. 6, the respective concentration may have a gradient. More specifically, as shown in FIG. 7(c), of a plurality of GaInN layers 76, the p-type impurity concentration of the $In_{0.05}Ga_{0.95}N$ layer 76 close to the cladding layer 36 is higher, while that of the $In_{0.05}Ga_{0.95}N$ layer 76 close to the cladding layer 40 is lower. On the other hand, of a plurality of $In_{0.05}Ga_{0.95}N$ layers 78, the n-type impurity concentration of the $In_{0.05}Ga_{0.95}N$ layer 76 close to the cladding layer 36 is lower, while the p-type impurity concentration of the $In_{0.05}Ga_{0.95}N$ layer 76 close to the cladding layer 40 is higher. Such a structure enables the further increase in emission efficiency.

Figure 8:
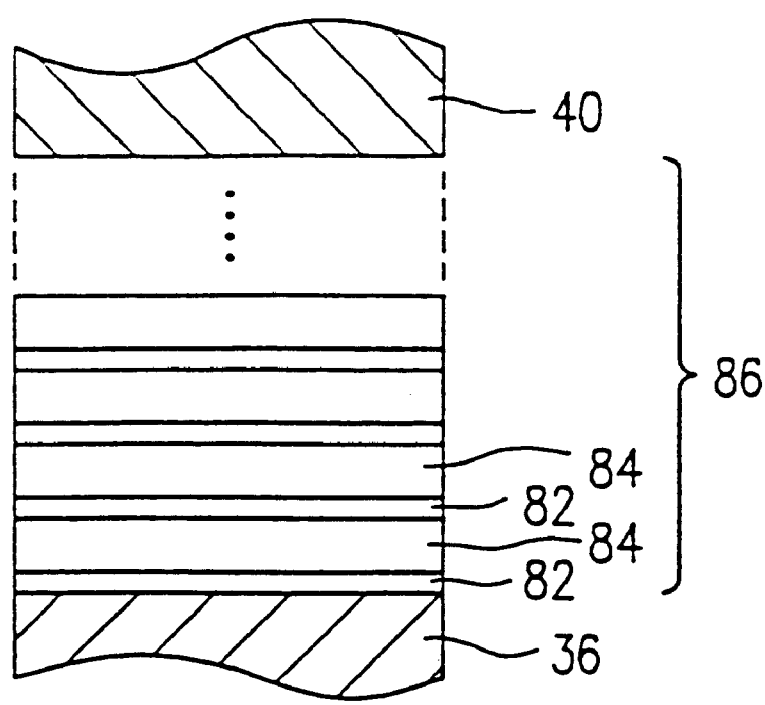
FIG. 8 is a cross-sectional view showing the structure of still another active layer of the first example.

Alternatively, as shown in FIG. 8, an active layer 86 with a layered structure including InN 82 layers and GaN layers 84 can be provided between the cladding layers 36 and 40. By alternately layering the InN layers 82 having a thickness of a 1-atom layer and the GaN layers 84 having a thickness of a 9-atoms layer in the active layer 86, the active layer 86 having a composition of $In_{0.1}Ga_{0.9}N$ as a whole can be formed. In this case, only the InN layers 82 are preferably doped with both zinc and silicon. This is because In has a vapor pressure higher than that of Ga and is likely to be replaced by impurities. This allows both zinc and silicon to enter the positions of In atoms in crystal and to respectively become p-type and n-type impurities without fail. Consequently, the activation ratio of the p-type impurity and the emission efficiency can be enhanced.

The active layer 86 is grown by Atomic Layer Epitaxy. More specifically, nine GaN layers can be grown on the substrate by alternately introducing trimethylgallium and ammonia into a growth chamber nine times, and one InN layer can be grown by alternately introducing trimethylindium and ammonia into a growth chamber once. The InN layers are grown by simultaneously supplying dimethylzinc and silane, and doping the InN layers with both zinc and silicon.

In the present example, although the case where sapphire is used for a substrate is described, other substrates made of SiC, spinel, ZnO, or the like can be used.

EXAMPLE 2

Figure 9:
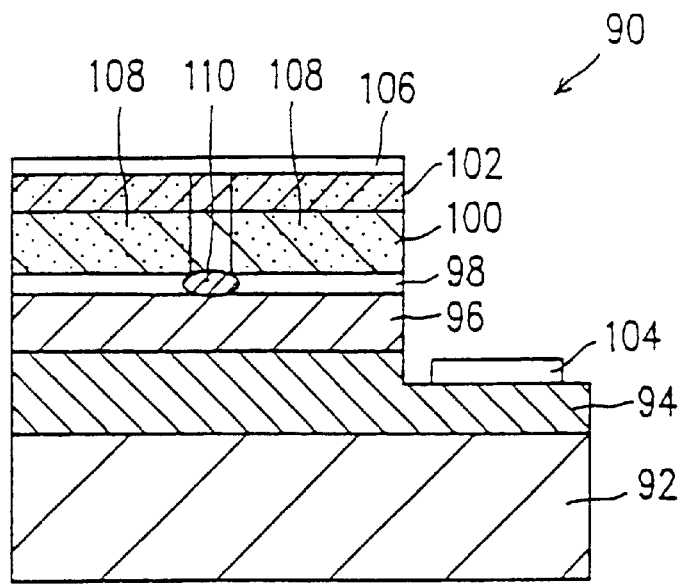
FIG. 9 shows a cross-section of a semiconductor light-emitting device of the second example according to the present invention.

FIG. 9 is a cross-sectional view of a blue semiconductor laser 90 of the second example according to the present invention.

The semiconductor laser 90 includes an active layer 98 and cladding layers 96 and 100 provided so as to sandwich the active layer 98. The active layer 98 is made of $In_{0.1}Ga_{0.9}N$. The cladding layer 96 is made of $Al_{0.1}Ga_{0.9}N$ doped with silicon as an n-type impurity, and the cladding layer 10 is made of $Al_{0.1}Ga_{0.9}N$ doped with magnesium as a p-type impurity. Therefore, the light-emitting diode 90 has a double hetero structure in which heterojunctions are formed between the active layer and the cladding layers.

The active layer 98 can be doped only with zinc as an impurity or can be an InGaN type semiconductor layer doped with both a p-type impurity and an n-type impurity described in detail in Example 1. More specifically, the active layer 98 can be an InGaN type semiconductor layer doped with p-type and n-type impurities by an impurity doping method similar to that used for the active layer 38 of the light-emitting device shown in FIG. 1 or by an impurity doping method shown in FIGS. 6 through 8. Furthermore, as described later, the active layer 98 is doped with hydrogen in the vicinity of two facets forming a cavity, whereby the active layer 98 is provided with a high resistance.

The cladding layer 96 is provided on a sapphire substrate 92 having, for example, a (0001) plane via a contact layer 94 made of n-type GaN. A contact layer 102 made of p-type GaN is provided on the cladding layer 100. Furthermore, an electrode 106 is provided on the contact layer 102. Furthermore, the contact layer 102, the cladding layer 100, the active layer 98, and the cladding layer 96 are partially removed by etching. A part of the contact layer 94 is also etched up to approximately midpoint in the thickness direction, and an electrode 104 is provided on a face of the contact layer 94 exposed by etching.

A region 108 containing hydrogen is formed in portions of the contact layer 102 and the cladding layer 100. The region 108 has a high resistance because of hydrogen contained therein. The region containing no hydrogen has a stripe shape extending in the cavity direction, and this region is kept in a low resistance state. Thus, holes are effectively injected from the electrode 106 into a part 110 of the active layer 98 under the region of the cladding layer 100 containing no hydrogen, which enables carriers to be effectively confined and reduces a threshold current of the semiconductor laser. In this manner, a highly reliable semiconductor laser can be obtained by providing a current confinement function on a p-$Al_{0.1}Ga_{0.9}N$ cladding layer side.

The reason why the region 108 has a high resistance is as follows: Atomic hydrogen having entered crystal binds to a p-type impurity (acceptor impurity) or the most adjacent constituent element to degrade the function of the p-type impurity as an acceptor and inactivate the p-type impurity. This allows the region 108 to be equivalent to a semiconductor doped with no impurities and increases the resistance thereof.

Although similar inactivation is considered to be caused even in an n-type impurity, the effect of inactivation by hydrogen atoms is more conspicuous in a p-type semiconductor. Therefore, the function as a current confinement is desirably provided on the side of the p-type contact layer 102 and the p-type cladding layer 100. Furthermore, inactivation by atomic hydrogen particularly has a greater effect on materials of $Al_xGa_yIn_zN$ type. Atomic hydrogen allows p-$Al_xGa_yIn_zN$ to have a semi-insulating state and rapidly increases the resistance thereof, whereby carriers can be effectively confined. Therefore, a laser having a structure as shown in FIG. 4 can be produced.

Next, a method for producing this semiconductor laser will be described with reference to FIGS. 10(a), 10(b), 11, and 12(a) through 12(d).

Figure 10A:
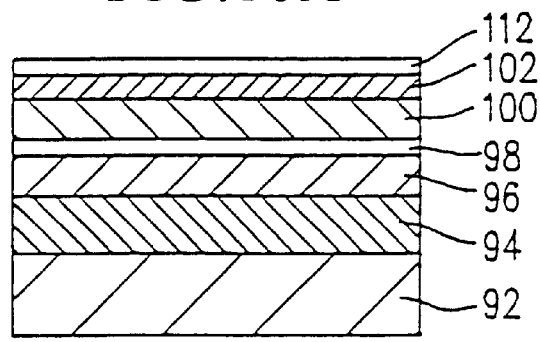
FIGS. 10(a) and 10(b) are cross-sectional views showing the first half of the fabrication process for the semiconductor light-emitting device shown in FIG. 9.

First, the contact layer 94 made of n-GaN, the cladding layer 96 made of n-$Al_{0.1}Ga_{0.9}N$, the active layer 98 made of $In_{0.1}Ga_{0.9}N$, the cladding layer 100 made of p-$Al_{0.1}Ga_{0.9}N$, and the contact layer 102 made of p-GaN are epitaxially grown on the sapphire substrate 92 having a (0001) plane by using a crystal growth method such as a MOVPE method (FIG. 10(a)). Furthermore, a mask layer 112 is formed on the contact layer 102. As the mask layer 112, semiconductor layers made of materials other than a p-type semiconductor or insulating layers can be used, as long as they do not allow hydrogen ions to pass through. For example, undoped GaN, n-type GaAs, p-type GaN, $SiO_2$, $Si_3N_4$, Si, and the like can be used for the mask layer. The mask layer 112 is formed into a stripe shape by using a photolithography technique and an etching technique, thereby exposing a part of the contact layer 102 (FIG. 10(b)).

Figure 10B:
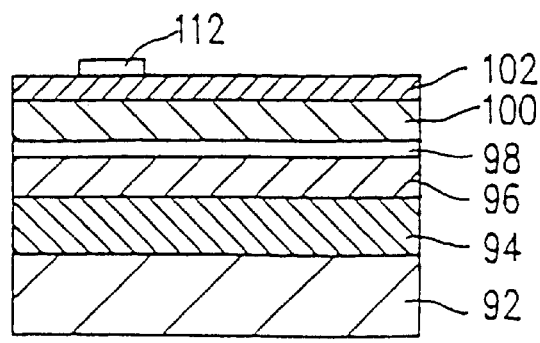
Figure 11:
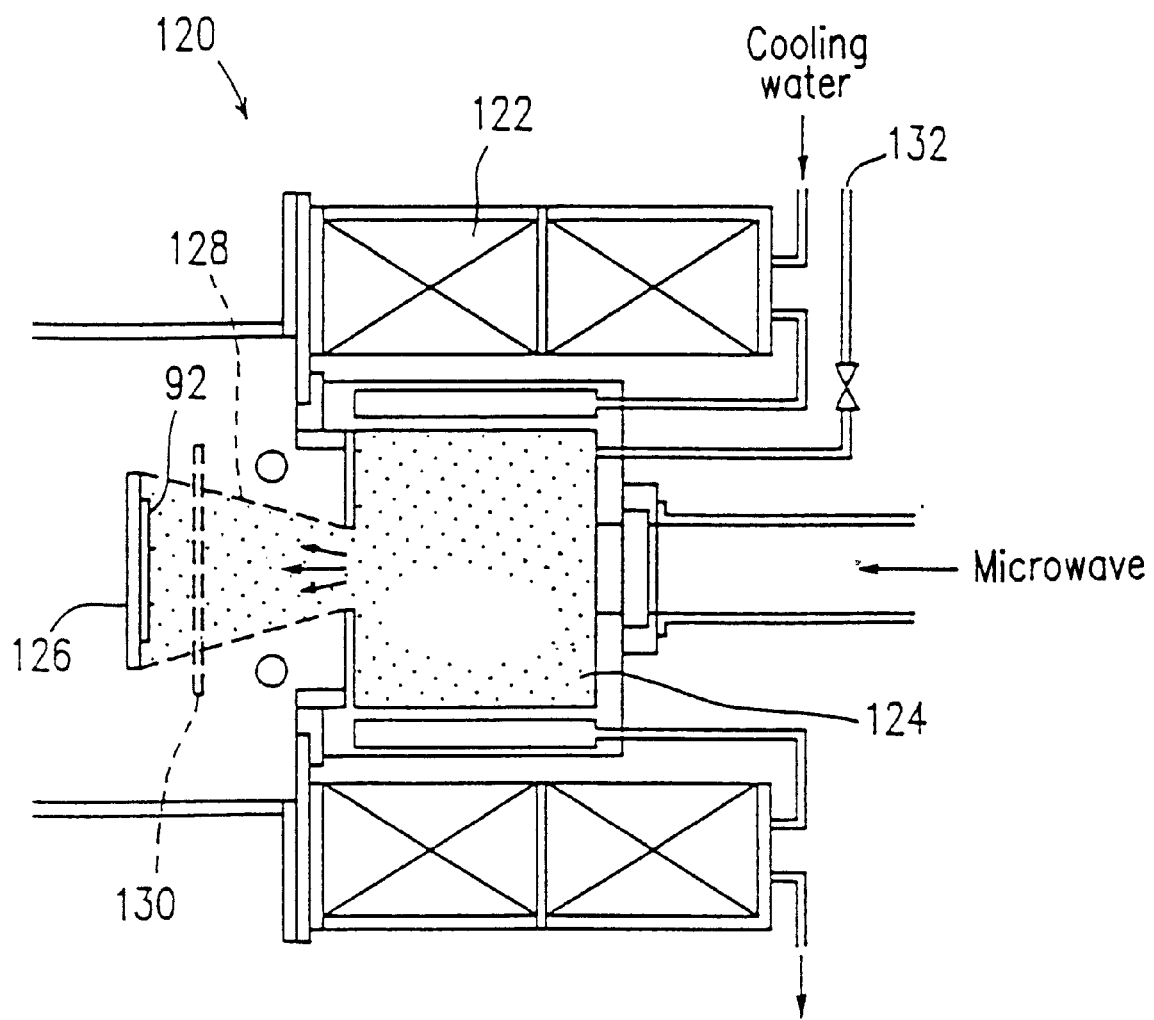
FIG. 11 schematically shows a cross-section of an electron cyclotron resonance apparatus used in the present example.

Hydrogen ions are introduced into a semiconductor structure shown in FIG. 10(b) by using an electron cyclotron resonance (ECR) apparatus 120 as shown in FIG. 11. The electron cyclotron resonance apparatus 120 is equipped with a chamber 124, magnet coils 122 provided on the periphery of the chamber 124, a sample holder 126, a shutter 130, and a gas inlet 132. Hydrogen introduced into the chamber 124 through the gas inlet 132 is excited with a microwave to form plasma 128 in the chamber 124. The flow of plasma 128 is radiated to the sapphire substrate 92 set on the sample holder 126. At this time, the sapphire substrate 92 is kept at a temperature of about 350° C. As a result, atomic hydrogen is injected from the surface of the contact layer 102 which is not covered with the mask layer 112 into the contact layer 102 and the cladding layer 100 (FIG. 12(a)). This is because atomic hydrogen cannot pass through the mask layer 112 and the mask layer 112 functions as a mask. During this step, the region 108 in which an acceptor is inactivated is formed. Thereafter, the semiconductor layer 112 is removed so as to expose the entire surface of the contact layer 102, and then the electrode 106 is formed (FIG. 12(b)).

Figure 12A:
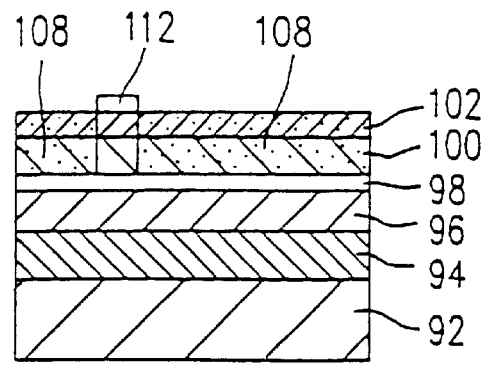
FIGS. 12(a) through (d) are cross-sectional views showing the second half of the fabrication process for the semiconductor light-emitting device shown in FIG. 9.
Figure 12B:
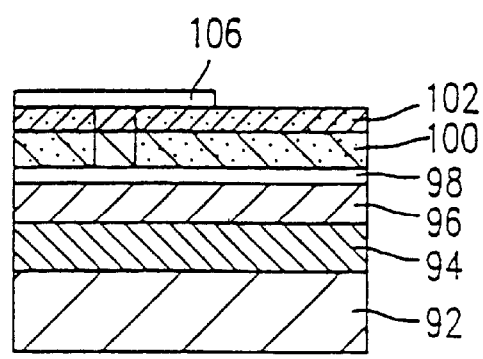
Figure 12C:
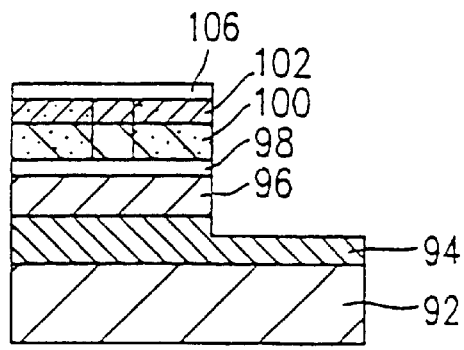
Figure 12D:
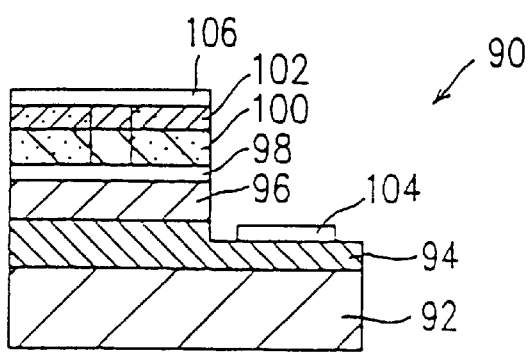
Figure 13:
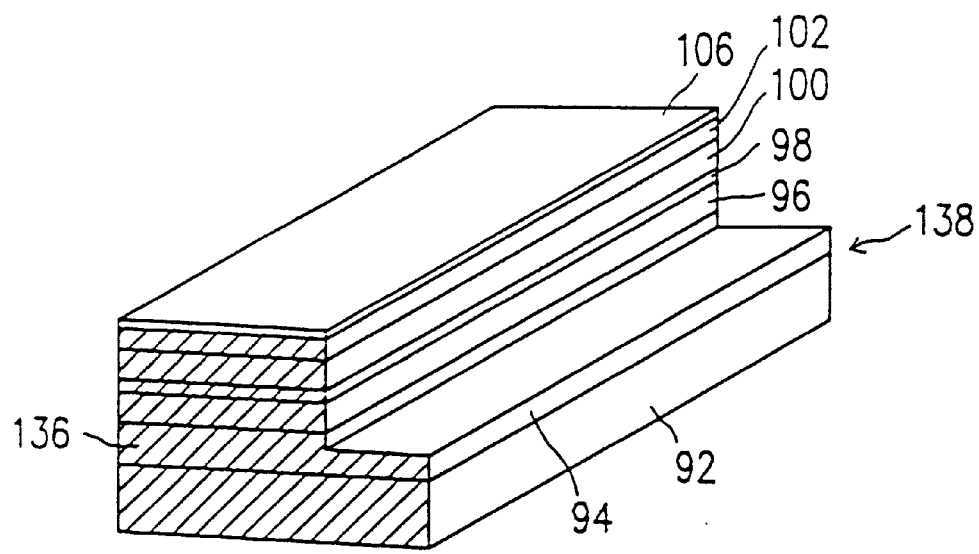
FIG. 13 is a perspective view showing one of the fabrication process for the semiconductor light-emitting device shown in FIG. 9.

Thereafter, the sapphire substrate 92 with the structure shown in FIG. 12(b) is introduced into the electron cyclotron resonance (ECR) apparatus 120, and portions of the contact layer 102, the cladding layer 100, the active layer 98, and the cladding layer 96 are etched, and a portion of the contact layer 94 is etched to a midpoint thereof (FIG. 12(c)). Furthermore, as shown in FIG. 13, facets of a cavity 136 and 138 are formed by etching.

Then, hydrogen is introduced into the chamber 124 through the gas inlet 132 while the sapphire substrate 92 is kept at about 350° C., and the etched facets are exposed to an atmosphere of hydrogen which has been excited into plasma by electron cyclotron resonance. This allows atomic hydrogen to enter the cavity through the facets 136 and 138 thereof, and an intrinsic defect such as vacancy in the vicinity of the facets of the cavity are compensated by hydrogen. As a result, a non-radiative center is prevented from being formed, and the increase in working current and the decrease in reliability can be suppressed.

Finally, the electrode 104 is formed on the contact layer 94, whereby the semiconductor laser 90 is completed.

According to such a method, a highly reliable semiconductor laser can be produced easily with good yield without subjecting regions close to the active layer to processings such as etching. Electron cyclotron resonance enables a high-resistant region to be efficiently formed because of good excitation efficiency of hydrogen. In addition, unlike ion implantation or the like, almost no damage is caused with respect to semiconductor crystal. Electron cyclotron resonance enables a high-resistant region to be efficiently formed because of good excitation efficiency of hydrogen. Furthermore, according to electron cyclotron resonance, since hydrogen plasma is not likely to diffuse in a magnetic field direction, i.e., in a horizontal direction of each layer forming a semiconductor laser, atomic hydrogen can be allowed to enter the layered structure with width almost equal to that of the mask layer 112 formed into a stripe shape. This effect is great, because the width of the stripe is small, i.e., about 4 μm.

Furthermore, implantation of atomic hydrogen into the vicinity of the facets 136 and 138 of the cavity increases the resistance of the semiconductor layer in the vicinity of the facets. Thus, heat generation can be suppressed in the vicinity of the facets of the cavity, whereby the increase in temperature of the facets of the cavity is reduced, resulting in enhanced reliability of the semiconductor laser.

Although the temperature of the sample placed in hydrogen excited into plasma is kept at about 350° C. in the above example, inactivation of acceptors by hydrogen atoms can be controlled by changing this temperature. Furthermore, the example is described using hydrogen as a gas containing a hydrogen element. However, any gas such as ammonia (NH$_3$) can be used, as long as it is a gas containing a hydrogen element.

Figure 14:
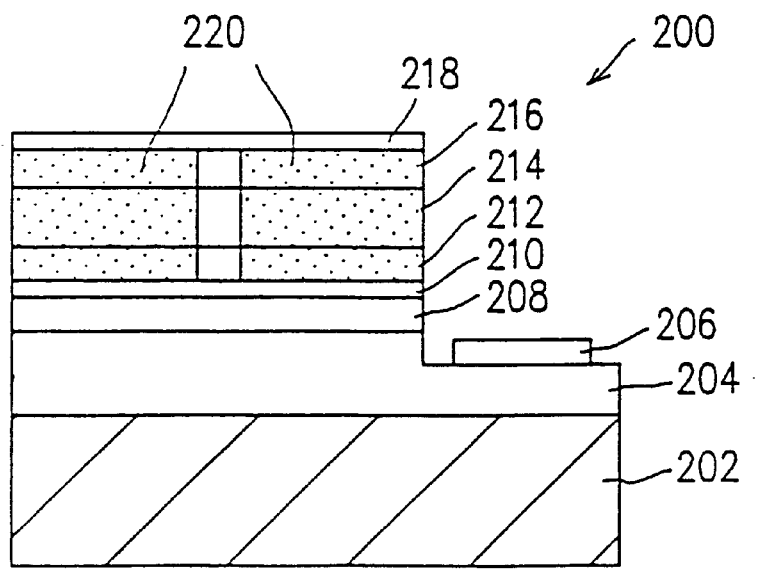
FIG. 14 is a cross-sectional view showing another structure of the second example.

The above example is described using an AlGaInN type material as that for forming the semiconductor laser. However, other materials with large bandgap can be used. Even a ZnMgSSe type material which is a II–VI-group compound is used, the effect of the present invention is great. For example, as shown in FIG. 14, the present invention can be applied to a semiconductor laser 200 including a cladding layer 204 made of n-ZnMgSSe, a light confinement layer 208 made of n-ZnSe, an active layer 210 made of CdZnSe, a light confinement layer 212 made of p-ZnSe, a cladding layer 214 made of p-ZnMgSSe, and a contact layer 216 made of p-ZnSe on a substrate 202 made of semi-insulating ZnSe. A region 220 doped with hydrogen is formed in portions of the contact layer 216, the cladding layer 214, and the light confinement layer 212. A current flowing through the active layer 210 is confined by a voltage applied across an electrode 218 formed on the contact layer 216 and an electrode 204 formed on the cladding layer 204.

In the present example, although the case where sapphire is used for a substrate is described, other materials such as SiC, spinel, and ZnO can be used for the substrate.

EXAMPLE 3

In the present example, a method for mounting a semiconductor laser according to the present invention will be described.

Figure 15:
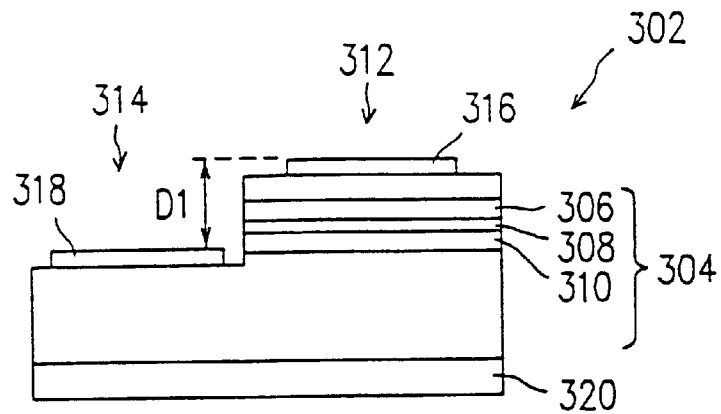
FIG. 15 is a cross-sectional view showing the structure of a semiconductor light-emitting device used in the third example.

A semiconductor laser 302 used in the present example has a semiconductor structure 304 formed on a substrate 320 made of sapphire or the like, as shown in FIG. 15. The semiconductor structure 304 includes an active layer 308 and cladding layers 306 and 310 sandwiching the active layer. The active layer 306 is made of In$_x$Ga$_{1-x}$N, and the cladding layers 306 and 310 are made of p-Al$_y$Ga$_{1-y}$N and n-Al$_y$Ga$_{1-y}$N, respectively. The semiconductor structure 304 has a step difference, which forms a concave portion 314 and a projected portion 312. At least the active layer 306 is included in the projected portion 312. An electrode 316 is formed on the surface of the projected portion 312 so as to be electrically connected to the cladding layer 306, and an electrode 318 is formed on the surface of the concave portion 314 so as to be electrically connected to the cladding layer 310. There is a gap D1 of 2.8 µm between the surface of the electrode 316 and that of the electrode 318.

Figure 16:
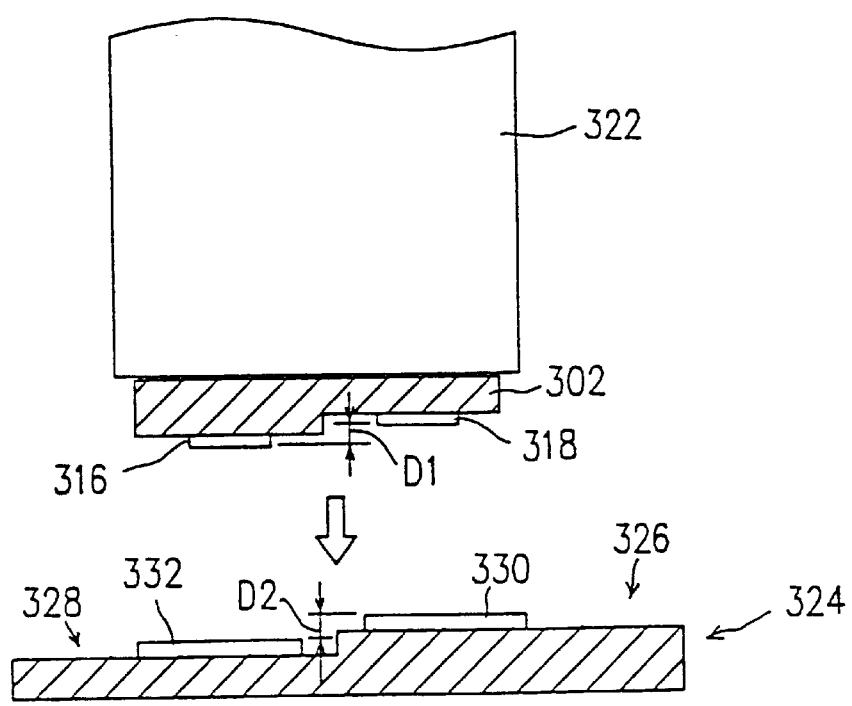
FIG. 16 is a cross-sectional view illustrating a method for mounting a light-emitting device shown in FIG. 15 on a mount.

As shown in FIG. 16, a mount 324 on which a semiconductor laser 302 is mounted also has a step difference, forming a projected portion 326 and a concave portion 328. On the surfaces of the projected portion 326 and the concave portion 328, bumps 330 and 332 are respectively provided. The mount 324 is made of a heat sink, Si, and the bumps 330 and 332 are made of an alloy of gold and tin. There is a gap D2 of 3.0 µm between the surfaces of the bumps 330 and 332.

A mounting method will be described with reference to FIG. 16. The semiconductor laser 302 is set on a submount 324 by using a vacuum collet 322. When the semiconductor laser 302 is brought closer to the mount 324, the electrode 318 on the semiconductor laser 302 first comes into contact with the bump 330 because D2 is larger than D1. A load is imposed from the semiconductor laser 302 side to crush the bump 330 so as to make it thinner, whereby the electrode 316 is brought into contact with the bump 332. Thereafter, a Si submount 301 is heated to 280° C. to melt the bumps 330 and 332, whereby the semiconductor 302 is brought into contact with the submount 324.

According to the above-mentioned method, a semiconductor laser with unevenness can be brought into contact with a heat sink with good heat conduction. Thus, the increase in temperature of the semiconductor laser can be suppressed, and reliability of the device can be prevented from decreasing.

Furthermore, the electrode 318 provided on the concave portion 314 of the semiconductor laser 302 comes into contact with the bump 330, so that the active layer 308 of the semiconductor laser is not excessively pressurized. Thus, the semiconductor laser is not adversely affected. In particular, there is no problem that plane of polarization of emitted light rotates due to birefringence of the constituent materials caused by stress.

In the above example, an alloy of gold and tin is used for bumps. However, any materials can be used, which are capable of being melted to bring the semiconductor laser into contact with the heat sink. For example, an alloy of lead and gold, indium, and the like can be used.

Figure 17:
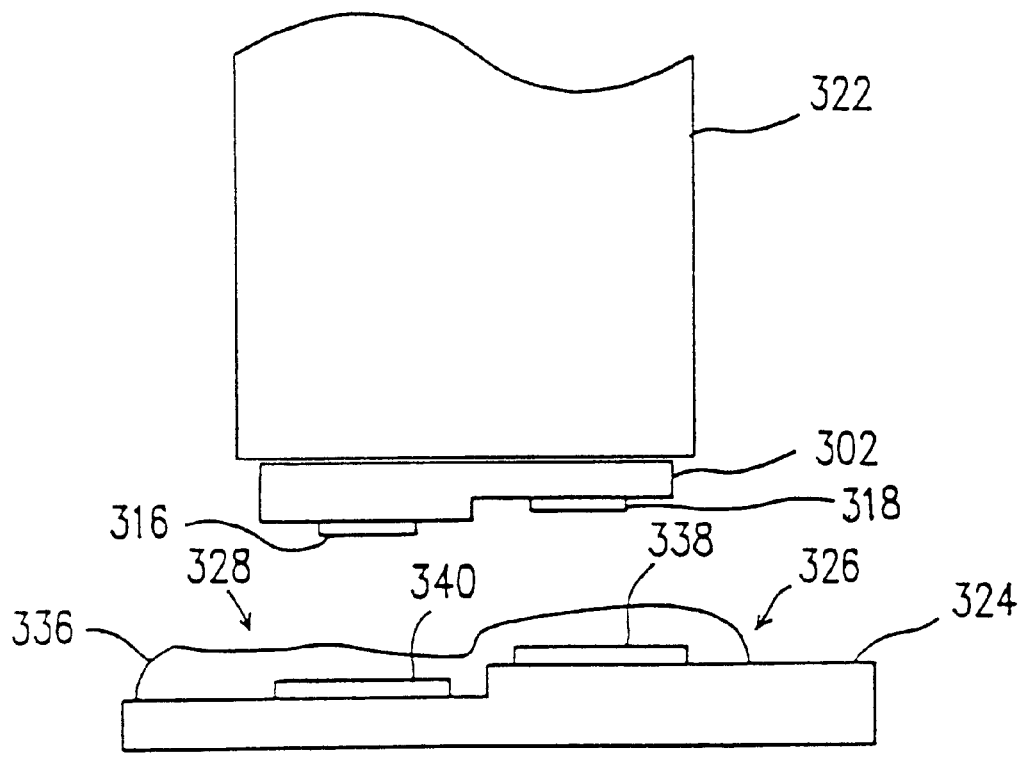
FIG. 17 is a cross-sectional view illustrating another method for mounting a light-emitting device on a mount, according to the third example.
Figure 18:
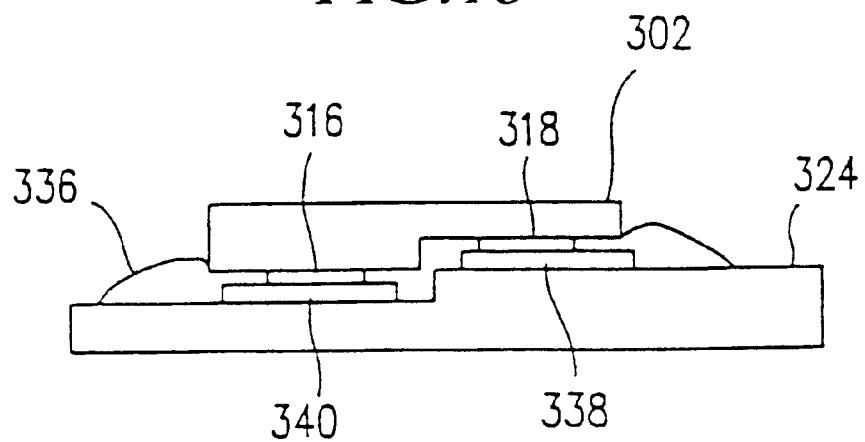
FIG. 18 shows a cross-section of the semiconductor light-emitting device mounted according the method illustrated in FIG. 17.

As described below, a UV-curable resin can be injected between the semiconductor laser 302 and the mount 324. As shown in FIGS. 17 and 18, a UV-curable resin 336 is coated onto the surface of the mount 324 so as to cover the electrode bumps 338 and 340 respectively provided on the projected portion 326 and the concave portion 328 of the submount 306. In this case, the bumps 338 and 340 are gold-plated.

As described above, first, the electrode 318 of the semiconductor laser 302 is brought into contact with the bump 338. A load is imposed from the semiconductor laser 302 side to crush the bump 338 so as to make it thinner, whereby the electrode 316 is brought into contact with the bump 340. At this time, the contact between the electrode 318 and the bump 338 can be confirmed by monitoring resistance between the bumps 338 and 340. Thereafter, a voltage is applied to the semiconductor laser 302, thereby allowing the laser to emit light. In this case, the laser is not necessarily oscillated. The UV-curable resin 336 is cured by absorbing light having leaked from the semiconductor laser 302, whereby the semiconductor laser 302 can be mounted on the submount 324. Examples of materials for the semiconductor laser emitting light with a wavelength capable of efficiently curing the UV-curable resin include those of an AlGaInN type, ZnMgSSe type, and the like.

A semiconductor laser with unevenness can be brought into contact with a heat sink with good heat conduction by the above-mentioned method. Thus, the increase in temperature of the semiconductor laser can be reduced, preventing reliability of the semiconductor laser from decreasing.

Furthermore, the electrode 318 provided on the concave portion 314 of the semiconductor laser 302 comes into contact with the bump 338, so that the active layer 308 of the semiconductor laser is not excessively pressurized. Thus, the semiconductor laser is not adversely affected. In particular, there is no problem that plane of polarization of emitted light rotates due to birefringence of the constituent materials caused by stress.

In the above example, the UV-curable resin is cured by allowing the semiconductor laser to emit light. However, the UV-curable resin can be cured by being irradiated with UV-rays from outside.

In the above example, although a UV-curable resin is used as that for mounting the semiconductor laser onto the submount, a thermosetting resin can also be used. Furthermore, even when other materials having a good heat-releasing property, such as SiC, C, and AlN, are used for the submount; the effect of the present invention is great.

Figure 19:
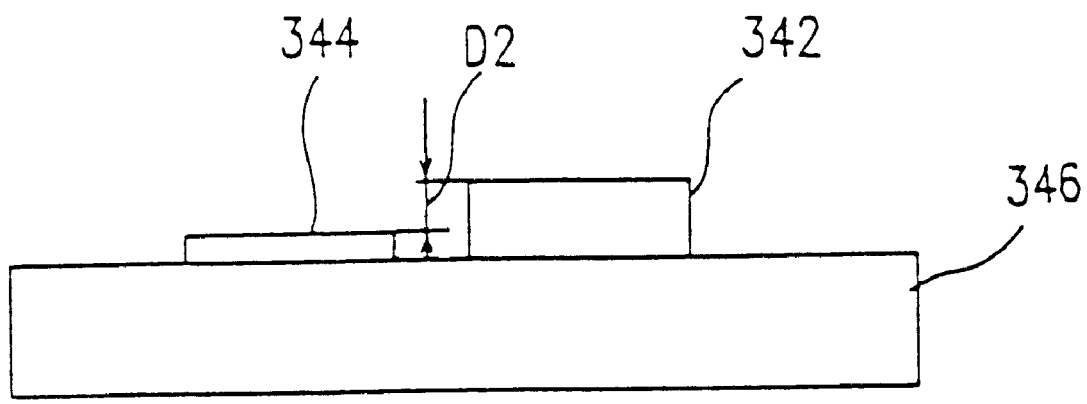
FIG. 19 shows another structure of a mount used in the third example.

Furthermore, the Si submount has unevenness in the above example. However, two bumps 342 and 344 having difference D2 in thickness are provided on a mount 346 with a flat surface as shown in FIG. 19. The semiconductor laser can be mounted on the mount in the same way as the above.

INDUSTRIAL APPLICABILITY

According to the present invention, a highly reliable light-emitting device can be obtained, which is capable of emitting light with a wavelength in a blue region at a high emission efficiency. Furthermore, a semiconductor light-emitting device with an outstanding heat-releasing property can be obtained, in which there is less rotation of the plane of polarization of emitted light.

Additionally, a method for producing such a blue light-emitting device by simple steps with high yield can be provided.

What is claimed is:

1. A method for producing a semiconductor light-emitting device, comprising the steps of:

forming a semiconductor structure, on a substrate, including an active layer and first and second cladding layers sandwiching the active layer;

removing portions of the active layer and the first and second cladding layers to form a projected portion and a concave portion in the semiconductor structure;

forming first and second electrodes on the concave portion and the projected portion of the semiconductor structure, respectively; and providing the semiconductor structure on a heat sink having a first portion and a second portion in such a manner that the second electrode comes into contact with the second portion of the heat sink after the first electrode comes into contact with the first portion of the heat sink.

2. A method for producing a semiconductor light-emitting device according to claim 1, wherein the first and second portions of the heat sink are respectively disposed on the heat sink at such positions that when facing the first and second portions to the first and second electrodes, a distance between the first portion and the first electrode is shorter than a distance between the second portion and the second electrode.

3. A method for producing a semiconductor light-emitting device according to claim 1, wherein the first and second electrodes of the semiconductor structure are respectively disposed in the semiconductor structure at such positions that when facing the first and second electrodes to the first and second portions of the heat sink, a distance between the first portion and the first electrode is shorter than a distance between the second portion and the second electrode.

\* \* \* \* \*